United States Patent
Khandelwal et al.

(10) Patent No.: US 8,513,116 B2
(45) Date of Patent: *Aug. 20, 2013

(54) ATOMIC LAYER DEPOSITION OF TUNGSTEN MATERIALS

(75) Inventors: Amit Khandelwal, Cupertino, CA (US); Madhu Moorthy, San Jose, CA (US); Avgerinos V. Gelatos, Redwood City, CA (US); Kai Wu, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/491,191

(22) Filed: Jun. 7, 2012

(65) Prior Publication Data

US 2012/0244699 A1  Sep. 27, 2012

Related U.S. Application Data

(63) Continuation of application No. 13/160,378, filed on Jun. 14, 2011, now Pat. No. 8,211,799, which is a continuation of application No. 12/121,209, filed on May 15, 2008, now Pat. No. 7,964,505, and a continuation-in-part of application No. 11/038,592, filed on Jan. 19, 2005, now Pat. No. 7,405,158.

(60) Provisional application No. 60/938,124, filed on May 15, 2007.

(51) Int. Cl.
*H01L 21/285* (2006.01)

(52) U.S. Cl.
USPC ...... 438/653; 438/677; 438/680; 257/E21.16; 257/E21.171; 257/E21.585

(58) Field of Classification Search
USPC .............. 438/653, 677, 680; 257/E21.16, 257/E21.171, E21.585
See application file for complete search history.

(56) References Cited

U.S. PATENT DOCUMENTS 4,058,430 A  11/1977  Suntola et al.
4,389,973 A   6/1983  Suntola et al.
(Continued)

FOREIGN PATENT DOCUMENTS

DE  19627017     1/1997
JP  05-206081 A  8/1993
(Continued)

OTHER PUBLICATIONS

Bader, et al., "Integrated Processing Equipment," Solid State Technology, Cowan Publ., vol. 33, No. 5 (May 1, 1990), pp. 149-154.

(Continued)

*Primary Examiner* — Alexander Ghyka
*Assistant Examiner* — Stanetta Isaac
(74) *Attorney, Agent, or Firm* — Patterson & Sheridan, LLP

(57) ABSTRACT

Embodiments of the invention provide a method for depositing tungsten-containing materials. In one embodiment, a method includes forming a tungsten nucleation layer over an underlayer disposed on the substrate while sequentially providing a tungsten precursor and a reducing gas into a process chamber during an atomic layer deposition (ALD) process and depositing a tungsten bulk layer over the tungsten nucleation layer, wherein the reducing gas contains hydrogen gas and a hydride compound (e.g., diborane) and has a hydrogen/hydride flow rate ratio of about 500:1 or greater. In some examples, the method includes flowing the hydrogen gas into the process chamber at a flow rate within a range from about 1 slm to about 20 slm and flowing a mixture of the hydride compound and a carrier gas into the process chamber at a flow rate within a range from about 50 sccm to about 500 sccm.

20 Claims, 7 Drawing Sheets

(56) References Cited

U.S. PATENT DOCUMENTS

| | | | |
|---|---|---|---|
| 4,413,022 A | 11/1983 | Suntola et al. | |
| 4,486,487 A | 12/1984 | Skarp et al. | |
| 4,767,494 A | 8/1988 | Kobayashi et al. | |
| 4,806,321 A | 2/1989 | Nishizawa et al. | |
| 4,813,846 A | 3/1989 | Helms et al. | |
| 4,829,022 A | 5/1989 | Kobayashi et al. | |
| 4,834,831 A | 5/1989 | Nishizawa et al. | |
| 4,838,993 A | 6/1989 | Aoki et al. | |
| 5,028,565 A | 7/1991 | Chang et al. | |
| 5,686,355 A | 11/1997 | Sumi et al. | |
| 7,405,158 B2* | 7/2008 | Lai et al. | 438/680 |
| 7,605,083 B2 | 10/2009 | Lai et al. | |
| 7,964,505 B2* | 6/2011 | Khandelwal et al. | 438/680 |
| 8,211,799 B2* | 7/2012 | Khandelwal et al. | 438/680 |
| 2011/0244682 A1 | 10/2011 | Khandelwal et al. | |

FOREIGN PATENT DOCUMENTS

| | | |
|---|---|---|
| JP | 06-089873 | 3/1994 |
| JP | 07-094425 A | 4/1995 |
| JP | 07-094727 | 4/1995 |
| JP | 08-124876 A | 5/1996 |
| JP | 11054459 A | 2/1999 |
| JP | 2002536549 | 10/2002 |
| JP | 2005518088 A | 6/2005 |
| WO | WO-9851838 A1 | 11/1998 |
| WO | WO-0047404 | 8/2000 |
| WO | WO-03029515 A2 | 4/2003 |

OTHER PUBLICATIONS

Office Action dated Feb. 16, 2012 for Japanese Patent Application No. 2001-192423.

Office Action for Japanese Patent Application No. 2001-192423 dated Jul. 28, 2011.

Office Action for Japanese Patent Application No. 2008-181763 dated Dec. 15, 2011.

Office Action for Taiwan Patent Application No. 95101760 dated Oct. 13, 2011.

* cited by examiner

ATOMIC LAYER DEPOSITION OF TUNGSTEN MATERIALS

CROSS-REFERENCE TO RELATED APPLICATIONS

This application is a continuation of U.S. Ser. No. 13/160,378, filed on Jun. 14, 2011, and issued as U.S. Pat. No. 8,211,799, which is a continuation of U.S. Ser. No. 12/121,209, filed on May 15, 2008, and issued as U.S. Pat. No. 7,964,505, which claims benefit of U.S. Ser. No. 60/938,124, filed May 15, 2007, and which is a continuation-in-part of U.S. Ser. No. 11/038,592, filed on Jan. 19, 2005, and issued as U.S. Pat. No. 7,405,158, which are hereby incorporated by reference in their entirety.

BACKGROUND OF THE INVENTION

1. Field of the Invention

Embodiments of the invention relate to the processing of substrates, more particularly, to the deposition of tungsten layers on substrates using vapor deposition processes.

2. Description of the Related Art

The semiconductor processing industry, as well as other industries which utilize substrate processing techniques, continues to strive for larger production yields while increasing the uniformity of layers deposited on substrates having larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer.

Chemical vapor deposition (CVD) is one of the most common deposition processes employed for depositing layers on a substrate. CVD is a flux-dependent deposition technique that requires precise control of the substrate temperature and the precursors introduced into the processing chamber in order to produce a desired layer of uniform thickness. These requirements become more critical as substrate size increases, creating a need for more complexity in chamber design and gas flow technique to maintain adequate uniformity.

A variant of CVD that demonstrates excellent step coverage is cyclical deposition or atomic layer deposition (ALD). Cyclical deposition is based upon atomic layer epitaxy (ALE) and employs chemisorption techniques to deliver precursor molecules on a substrate surface in sequential cycles. The cycle exposes the substrate surface to a first precursor, a purge gas, a second precursor and the purge gas. The first and second precursors react to form a product compound as a film on the substrate surface. The cycle is repeated to form the layer to a desired thickness.

Formation of film layers at a high deposition rate while providing adequate step coverage are conflicting characteristics often necessitating the sacrifice of one to obtain the other. This conflict is true particularly when refractory metal layers are deposited over gaps or vias during the formation of contacts interconnecting adjacent metallic layers separated by dielectric layers. Historically, CVD techniques have been employed to deposit conductive material such as refractory metals in order to inexpensively and quickly form contacts. Due to the increasing integration of semiconductor circuitry, tungsten has been used based upon superior step coverage. As a result, deposition of tungsten employing CVD techniques enjoys wide application in semiconductor processing due to the high throughput of the process.

Depositing tungsten by conventional CVD methods, however, is attendant with several disadvantages. For example, ALD processes deposit tungsten films into vias containing high aspect ratios (e.g., 20), whereas conventional CVD processes will usually cause similar vias to "pinch-off" and not completely fill. Also, blanket deposition of a tungsten layer on a semiconductor wafer is time-consuming at temperatures below 400° C. The deposition rate of tungsten may be improved by increasing the deposition temperature to, for example, about 500° C. to about 550° C. However, temperatures in this higher range may compromise the structural and operational integrity of the underlying portions of the integrated circuit being formed. Use of tungsten has also frustrated photolithography steps during the manufacturing process as it results in a relatively rough surface having a reflectivity of 70% or less than that of silicon (thickness and wavelength dependent). Further, tungsten has proven difficult to deposit uniformly. Poor surface uniformity typically increases film resistivity.

Therefore, there is a need for an improved method to deposit tungsten-containing materials having good uniformity, none or minimum contaminants, and high conductivity or low resistivity using ALD processes.

SUMMARY OF THE INVENTION

Embodiments of the invention provide an improved process for depositing tungsten-containing materials. The process utilizes soak processes and vapor deposition processes, such as atomic layer deposition (ALD) to provide tungsten-containing materials having significantly improved conductivity, surface uniformity, and production level throughput. In one embodiment, a method for forming a tungsten-containing material on a substrate is provided which includes positioning a substrate within a process chamber, wherein the substrate contains an underlayer disposed thereon, exposing the substrate sequentially to a tungsten precursor and a reducing gas to deposit a tungsten nucleation layer on the underlayer during an atomic layer deposition process, wherein the reducing gas contains a hydrogen/hydride flow rate ratio of about 40:1 or greater, and depositing a tungsten bulk layer on the tungsten nucleation layer. The reducing gas contains a hydride compound, such as silane, disilane, diborane, phosphine, derivatives thereof, or combinations thereof.

In some examples, the hydrogen/hydride flow rate ratio of the reducing gas is about 100:1 or greater, such as about 500:1 or greater, such as about 800:1, about 1,000:1, about 1,200:1, or greater. The hydride compound may have a flow rate within a range from about 1 sccm to about 40 sccm, preferably, from about 3 sccm to about 30 sccm, and more preferably, from about 5 sccm to about 15 sccm. The reducing gas contains hydrogen having a flow rate within a range from about 1 slm to about 20 slm, preferably, from about 3 slm to about 15 slm, and more preferably, from about 5 slm to about 10 slm.

In some embodiments, the method further provides include exposing the underlayer to a pre-soak gas containing a reducing agent during a pre-soak process, prior to depositing the tungsten nucleation layer. In other embodiments, the method may include exposing the tungsten nucleation layer to a post-soak gas containing a reducing agent during a post-soak process. The reducing agent may contain silane, disilane, diborane, phosphine, derivatives thereof, or combinations thereof. The substrate may be exposed to the reducing agent for a time period within a range from about 5 seconds to about 60 seconds, preferably, from about 10 seconds to about 30 seconds, and more preferably, from about 15 seconds to about 20 seconds. In some examples, the pre-soak gas or the post-soak gas independently may contain a hydrogen/hydride flow rate ratio of about 40:1 or greater, such as about 100:1, about 500:1, about 800:1, about 1,000:1, about 1,200:1, or greater.

In some examples, the substrate may be heated to a temperature within a range from about 200° C. to about 600° C., preferably, from about 300° C. to about 500° C., more preferably, from about 350° C. to about 420° C., and more preferably, from about 375° C. to about 400° C. during the ALD process, the pre-soak process, or the post-soak process. The process chamber may have an internal pressure within a range from about 1 Torr to about 300 Torr, preferably, from about 1 Torr to about 100 Torr, more preferably, from about 10 Torr to about 50 Torr, and more preferably, from about 20 Torr to about 40 Torr during the ALD process, the pre-soak process, and/or the post-soak process.

The tungsten bulk layer may be deposited by a traditional chemical vapor deposition (CVD) process, such as by co-flowing tungsten hexafluoride and hydrogen gas into the process chamber. The tungsten bulk layer may have a resistivity measured across the substrate of about 20 $\mu\Omega$-cm or less, preferably, about 16 $\mu\Omega$-cm or less, such as about 10 $\mu\Omega$-cm or less, preferably, about 9 $\mu\Omega$-cm or less, more preferably, about 8 $\mu\Omega$-cm or less, and more preferably, about 7 $\mu\Omega$-cm or less. The tungsten nucleation layer may have a thickness within a range from about 2 Å to about 100 Å, such as less than about 50 Å.

In one embodiment, the underlayer is a barrier layer that may contain metallic titanium, titanium nitride, metallic tantalum, tantalum nitride, silicides thereof, derivatives thereof, alloys thereof, or combinations thereof. The barrier layer may be deposited by an ALD process, a CVD process, or a physical vapor deposition (PVD) process. In another embodiment, the underlayer is a nucleation/barrier layer that may contain ruthenium, nickel, cobalt, metallic tungsten, tungsten nitride, silicides thereof, derivatives thereof, alloys thereof, or combinations thereof. The nucleation/barrier layer may be deposited by an ALD process or a PVD process.

In one example, a method for forming a tungsten-containing material on a substrate is provided which includes positioning a substrate within a process chamber, wherein the substrate contains an underlayer disposed thereon, exposing the substrate sequentially to a tungsten precursor and a reducing gas to deposit a tungsten nucleation layer on the underlayer during an ALD process, wherein the reducing gas has a hydrogen/diborane flow rate ratio of about 40:1 or greater and depositing a tungsten bulk layer on the tungsten nucleation layer.

In some examples, the hydrogen/diborane flow rate ratio of the reducing gas is about 100:1 or greater, such as about 500:1, about 800:1, about 1,000:1, or greater. The diborane may have a flow rate within a range from about 1 sccm to about 40 sccm, preferably, from about 3 sccm to about 30 sccm, and more preferably, from about 5 sccm to about 15 sccm. The reducing gas contains hydrogen having a flow rate within a range from about 1 slm to about 20 slm, preferably, from about 3 slm to about 15 slm, and more preferably, from about 5 slm to about 10 slm.

The method may further include exposing the underlayer to a pre-soak gas containing a reducing agent (e.g., diborane or silane) during a pre-soak process, prior to depositing the tungsten nucleation layer. The method may also include exposing the tungsten nucleation layer to a post-soak gas containing a reducing agent (e.g., diborane or silane) during a post-soak process.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of the invention and are therefore not to be considered limiting of its scope, for the invention may admit to other equally effective embodiments.

DETAILED DESCRIPTION

Embodiments of the invention provide an improved process for depositing tungsten-containing materials. The process utilizes high hydrogen to reducing agent ratios during pre-soak and post-soak processes and ALD process to provide tungsten-containing materials having significantly improved conductivity, surface uniformity, and production level throughput. In one embodiment, a method for forming a tungsten-containing material on a substrate is provided which includes exposing the substrate sequentially to a tungsten precursor and a reducing gas to deposit a tungsten nucleation layer on an underlayer (e.g., barrier layer) during an ALD process, wherein the reducing gas has a hydrogen/hydride flow rate ratio of about 40:1 or greater. In some examples, the hydrogen/hydride flow rate ratio of the reducing gas is about 100:1, about 500:1, about 800:1, about 1,000:1, about 1,200:1, or greater. The reducing gas contains a hydride compound, such as silane, disilane, borane, diborane, phosphine, derivatives thereof, or combinations thereof. Subsequently, a tungsten bulk layer may be deposited over the tungsten nucleation layer.

Figure 1:
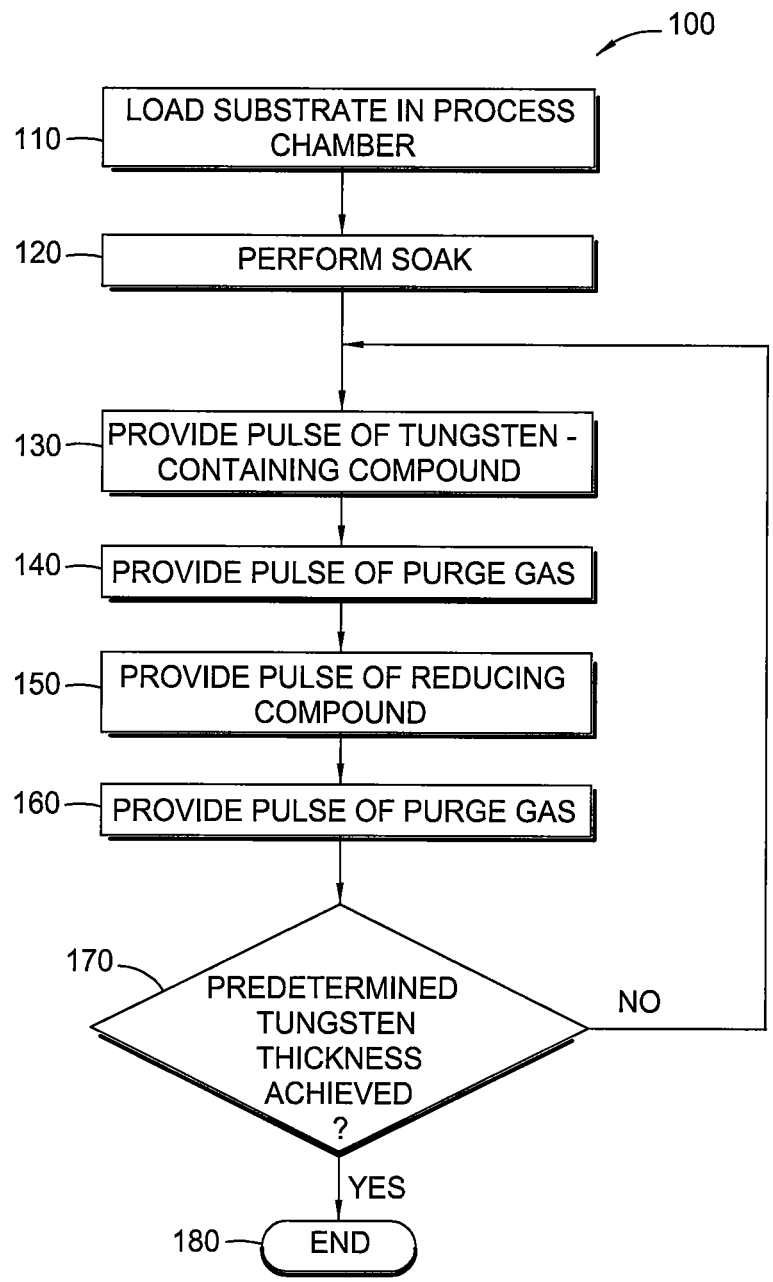
FIG. 1 illustrates a process sequence for the formation of a tungsten layer using a cyclical deposition technique according to one embodiment described herein.

FIG. 1 illustrates an exemplary process sequence 100 for forming an improved tungsten-containing film according to one embodiment of the invention. A substrate to be processed is first loaded into and positioned within a process chamber capable of performing cyclical deposition and the process conditions are adjusted (step 110). The substrate is then exposed to a soak process lasting within the range from about 1 second to about 90 seconds (step 120). A pulse of a tungsten-containing precursor accompanied with a suitable carrier gas is introduced into the processing chamber (step 130). A pulse of gas is then pulsed into the process chamber (step 140) to purge or otherwise remove any residual tungsten-containing precursor or by-products. Next, a pulse of a reductant or reducing compound accompanied with a suitable carrier gas is introduced into the process chamber (step 150). The reducing gas may contain the same reducing compound/agent as the gas used for the soak process (step 120) or alternatively, the reducing gas may contain a different reducing compound/agent, depending on the product throughput requirements and the device applications. A pulse of purge gas is then introduced into the processing chamber (step 160) to purge or otherwise remove any residual reducing compound.

Suitable carrier gases or purge gases include helium, argon, nitrogen, hydrogen, forming gas, or combinations thereof. Typically, a reducing gas which contains the borane or silane compounds also contains hydrogen, and may further contain argon or nitrogen.

Referring to step 170, after each deposition cycle (steps 130 through 160), a tungsten nucleation layer having a particular thickness will be deposited on the substrate surface. Usually, each ALD cycle may form a layer having a thickness within the range from about 0.1 Å to about 5 Å or less. Depending on specific device requirements, subsequent deposition cycles may be needed to deposit tungsten nucleation layer having a desired thickness. As such, a deposition cycle (steps 130 through 160) can be repeated until the desired thickness for the tungsten film is achieved. The nucleation layer is typically deposited to a thickness within the range from about 2 Å to about 200 Å. Thereafter, the process is stopped as indicated by step 180 when the desired thickness is achieved.

Suitable tungsten-containing precursors or compounds include tungsten hexafluoride ($WF_6$), tungsten hexachloride ($WCl_6$), tungsten carbonyl ($W(CO)_6$), bis(cyclopentadienyl) tungsten dichloride ($Cp_2WCl_2$), mesitylene tungsten tricarbonyl ($C_9H_{12}W(CO)_3$), or derivatives thereof. Suitable reducing compounds and soak compounds include silane compounds, borane compounds, phosphine compounds, ammonia, amine compounds, hydrogen, derivatives thereof, mixtures thereof, or combinations thereof. Silane compounds include silane, disilane, trisilane, tetrasilane, chlorosilane, dichlorosilane, tetrachlorosilane, hexachlorodisilane, methylsilane, or derivatives thereof. Borane compounds include borane, diborane, triborane, tetraborane, pentaborane, alkylboranes (e.g., triethylborane), or derivatives thereof. Several examples provide that the reducing gas used for the soak process contains silane, disilane, diborane, hydrogen, derivatives thereof, mixtures thereof, or combinations thereof.

The substrate surface generally contains a barrier layer disposed thereon. The tungsten nucleation layer may be deposited on the barrier layers. In one embodiment, the substrate surface may be exposed to a pre-soak gas while the substrate is heated. The substrate may be heated to a process temperature during step 110 or 120 and throughout steps 130-170 during process 100. The substrate may be heated to a process temperature within the range from about 100° C. to about 600° C., preferably, from about 200° C. to about 600° C., more preferably, from about 300° C. to about 500° C., more preferably, from about 350° C. to about 420° C., and more preferably, from about 375° C. to about 500° C., for example, prior to or during the pre-soak process. In one example, the temperature of the soak process is maintained for the subsequent vapor deposition process. The soak process (step 120) is typically performed with the internal pressure of the process chamber within the range from about 1 Torr to about 150 Torr, preferably, from about 1 Torr to about 100 Torr, more preferably, from about 10 Torr to about 50 Torr, and more preferably, from about 20 Torr to about 40 Torr. In some examples, a pressure is within the range from about 5 Torr to about 20 Torr. In another example, the pressure is about 40 Torr. The soak process is usually conducted to the substrate surface for a time period within the range from about 1 second to about 90 seconds. In one example, the soak process will last for about 60 seconds or less. In another example, the soak process will last for about 30 seconds or less. In another aspect, the soak process will last for about 10 seconds.

The substrate is exposed to a soak gas (e.g., pre-soak gas) or a reducing gas which contains hydrogen gas and a hydride compound, such as silane, disilane, diborane, phosphine, derivatives thereof, or combinations thereof. The reducing gas may be mixed within the processing/deposition chamber or outside and may be coming from multiple sources. In one example, the substrate is exposed to the reducing gas which is formed by combining in the chamber a gas flow of a reducing or hydride compound and hydrogen mixture (e.g., 5% $B_2H_6$ in $H_2$) along with a gas flow of hydrogen gas. In another example, the gas flow of the reducing or hydride compound and hydrogen mixture (e.g., 5% $B_2H_6$ in $H_2$) and the gas flow of hydrogen gas are combined prior to entering the chamber.

In one embodiment, the reducing gas contains a hydrogen/hydride flow rate ratio of about 40:1 or greater, preferably, about 100:1 or greater, preferably, about 500:1 or greater, more preferably, about 800:1 or greater, and more preferably, about 1,000:1 or greater. The hydride compound (e.g., diborane) may have a flow rate within a range from about 1 sccm to about 40 sccm, preferably, from about 3 sccm to about 30 sccm, and more preferably, from about 5 sccm to about 15 sccm. The hydride compound may be within a carrier gas (e.g., $H_2$), such that the mixture may have a flow rate within a range from about 50 sccm to about 500 sccm, preferably, from about 75 sccm to about 400 sccm, and more preferably, from about 100 sccm to about 300 sccm. The hydrogen gas may have a flow rate within a range from about 1 slm to about 20 slm, preferably, from about 3 slm to about 15 slm, and more preferably, from about 5 slm to about 10 slm. The hydrogen/hydride flow rate ratio may be calculated by dividing the total hydrogen flow rate by the total hydride flow rate. The total hydrogen flow rate contains the sum of all sources of hydrogen including the flow rate of any hydrogen carrier gas and the flow rate of any independent hydrogen gas.

The barrier layer disposed on the substrate is reduced and/or adsorbs the reductant to form a conditioned layer for the subsequent nucleation layer. The conditioned barrier layer provides for a quicker and smoother deposition of the nucleation layer. In one embodiment, in step 120, the reductant or reducing compound/agent utilized in the soak process is diborane or silane. In one example, the reducing gas contains a hydride compound (e.g., $B_2H_6$ or $SiH_4$) having a flow rate within a range from about 1 sccm to about 40 sccm and hydrogen gas having a flow rate within a range from about 1 slm to about 20 slm. In another example, the reducing gas contains the hydride compound having a flow rate within a range from about 3 sccm to about 30 sccm and the hydrogen gas having a flow rate within a range from about 3 slm to about 15 slm. In another example, the reducing gas contains the hydride compound having a flow rate within a range from about 5 sccm to about 15 sccm and the hydrogen gas having a flow rate within a range from about 5 slm to about 10 slm.

In step 130, the tungsten-containing precursor is preferably tungsten hexafluoride and introduced at a rate within the range from about 5 sccm to about 200 sccm. The tungsten-containing precursor can be introduced into the process chamber with a carrier gas, such as argon with a flow rate within the range from about 50 sccm to about 1,000 sccm.

In step 150, the reducing gas contains diborane or silane and is introduced into the process chamber. The reducing gas contains a hydride compound (e.g., $B_2H_6$ or $SiH_4$) having a flow rate within a range from about 1 sccm to about 40 sccm and hydrogen gas having a flow rate within a range from about 1 slm to about 20 slm. In another example, the reducing gas contains the hydride compound having a flow rate within a range from about 3 sccm to about 30 sccm and the hydrogen gas having a flow rate within a range from about 3 slm to about 15 slm. In another example, the reducing gas contains the hydride compound having a flow rate within a range from about 5 sccm to about 15 sccm and the hydrogen gas having a flow rate within a range from about 5 slm to about 10 slm.

The pulses of a purge gas, preferably argon or nitrogen, at steps 140 and 160, are typically introduced at a rate from about 50 sccm to about 2,000 sccm, preferably at about 500 sccm. Steps 140 and 160 may include a continuous flow of purge gas whereas the tungsten-containing compound and the reducing gas are pulsed into a steady stream of carrier gas. Each processing step (steps 130 through 160) lasts within a range from about 0.01 seconds to about 10 seconds, preferably, from about 0.1 seconds to about 1 second. Longer processing steps, such as about 30 seconds or about 60 seconds, achieve tungsten deposition. However, the throughput is reduced. The specific pressures and times are obtained through experimentation. In one example, a 300 mm diameter substrate or wafer needs about twice the flow rate as a 200 mm diameter substrate or wafer in order to maintain similar throughput.

An ALD process chamber used during embodiments described herein is available from Applied Materials, Inc., located in Santa Clara, Calif. A more detailed description of an ALD process chamber may be found in commonly assigned U.S. Pat. Nos. 6,878,206 and 6,916,398, and commonly assigned U.S. Ser. No. 10/281,079, filed on Oct. 25, 2002, and published as US 2003-0121608, which are hereby incorporated by reference in their entirety. Software routines are executed to initiate process recipes or sequences. The software routines, when executed, transform the general purpose computer into a specific process computer that controls the chamber operation so that a chamber process is performed. For example, software routines may be used to precisely control the activation of the electronic control valves for the execution of process sequences according to aspects of the invention. Alternatively, the software routines may be performed in hardware, as an application specific integrated circuit or other type of hardware implementation, or a combination of software or hardware.

Figure 2:
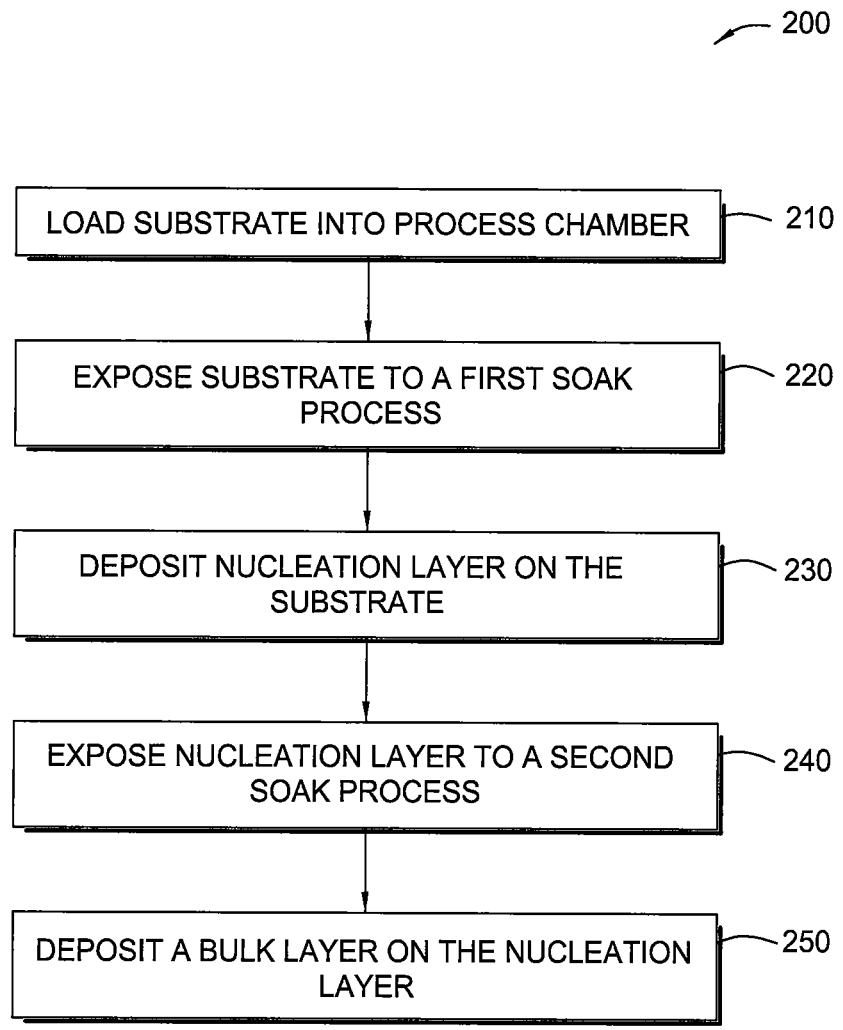
FIG. 2 illustrates a process sequence for the forming of a tungsten-containing material according to one embodiment described herein.

FIG. 2 illustrates process 200 for the forming of a tungsten-containing material according to one embodiment described herein. During step 210, the substrate is loaded into a process chamber. The substrate usually contains a barrier layer disposed thereon and is exposed to a pre-soak process or a first soak process during step 220. The soak process includes delivering pre-soak gas or a reducing gas containing a reductant into the process chamber. The substrate surface forms a treated layer, such as a reduced barrier layer. During step 230, a nucleation layer (e.g., tungsten) is deposited on the substrate. Generally, the nucleation layer is deposited by a vapor deposition process that includes ALD, CVD, or pulsed-CVD. In step 240, the nucleation layer is exposed to a second soak process with the same or a different reductant as used in step 220. Thereafter, a bulk layer (e.g., tungsten) is deposited on the nucleation layer during step 250. The bulk layer may be deposited by a CVD process.

During step 210, the substrate may be loaded into and positioned within the process chamber. The substrate surface or underlayer may contain a barrier layer, an adhesion, or an activation layer disposed thereon. Barrier layers usually contain a metallic material or a metal nitride material. In one embodiment, the underlayer is a barrier layer that contains metallic titanium, titanium nitride, metallic tantalum, tantalum nitride, silicides thereof, derivatives thereof, alloys thereof, or combinations thereof. The barrier layer may be deposited by an ALD process, a CVD process, or a physical vapor deposition (PVD) process. In another embodiment, the underlayer is a nucleation/barrier layer that may contain ruthenium, nickel, cobalt, metallic tungsten, tungsten nitride, silicides thereof, derivatives thereof, alloys thereof, or combinations thereof. The nucleation/barrier layer may be deposited by an ALD process, a CVD process, a PVD process, or combinations thereof.

The barrier layer is usually deposited to a thickness of at least about 30 Å, such as within the range from about 30 Å to about 100 Å. In one example, a barrier layer is deposited on the substrate surface by a CVD process by using tetrakis (dimethylamino)titanium (TDMAT) and ammonia. In another example, a barrier layer is deposited on the substrate surface by an ALD process by sequentially pulsing titanium tetrachloride ($TiCl_4$) and ammonia. In another example, a barrier layer is deposited on the substrate surface by a PVD process by sputtering from a titanium source in a nitrogen environment. The barrier layer may be plasma densified prior to performing a subsequent fabrication process. In another example, the underlayer is a tungsten and/or tungsten nitride layer deposited by a PVD process.

In one example, the underlayer is a barrier layer containing metallic titanium, titanium nitride, metallic tantalum, tantalum nitride, silicides thereof, derivatives thereof, alloys thereof, or combinations thereof and may be deposited by an ALD process, a CVD process, or a PVD process. In another example, the underlayer is a nucleation/barrier layer containing ruthenium, nickel, cobalt, metallic tungsten, tungsten nitride, silicides thereof, derivatives thereof, alloys thereof, or combinations thereof and may be deposited by an ALD process or a PVD process.

The process conditions, such as temperature and pressure, set during step 210 may be used during step 220. In one embodiment, the process chamber is adjusted to heat the substrate at a temperature within the range from about 100° C. to about 600° C., preferably, from about 200° C. to about 600° C., more preferably, from about 300° C. to about 500° C., more preferably, from about 350° C. to about 420° C., and more preferably, from about 375° C. to about 500° C., during the steps 210, 220, 230, and/or 240 during process 200. The process chamber may have an internal pressure within the range from about 1 Torr to about 150 Torr, preferably, from about 1 Torr to about 100 Torr, more preferably, from about 10 Torr to about 50 Torr, and more preferably, from about 20 Torr to about 40 Torr. In one example, the process chamber used during the soak process may be the same process chamber as used to deposit the barrier layer. In another example, the process chamber used during the soak process is used to deposit the subsequent nucleation layer during step 230.

During step 220, the substrate surface is exposed to a soak process containing a reductant and an optional carrier gas. The reductant adsorbs and/or reacts to the substrate surface, namely the barrier layer, to form a treated surface. The treated surface provides a quicker deposition process for an overall smooth and more uniform tungsten layer. The reductants may include silane compounds, borane compounds, phosphine compounds, ammonia, amine compounds, hydrogen, derivatives thereof, mixtures thereof, or combinations thereof. Silane compounds include silane, disilane, trisilane, tetrasilane, chlorosilane, dichlorosilane, tetrachlorosilane, hexachlorodisilane, methylsilane, or derivatives thereof, while borane compounds include borane, diborane, triborane, tetraborane, pentaborane, alkylboranes (e.g., triethylborane), or derivatives thereof. The preferred reductants include silane, disilane, diborane, and hydrogen. A carrier gas may be co-flowed with the reductant. Carrier gases include hydrogen, nitrogen, argon, helium, derivatives thereof, mixtures thereof, or combinations thereof.

The substrate may be exposed to the pre-soak gas or reducing gas during the pre-soak process in step 220 for a time period within the range from about 1 second to about 90 seconds, preferably, from about 5 seconds to about 60 seconds, more preferably, from about 10 seconds to about 30 seconds, and more preferably, from about 15 seconds to about 20 seconds. The barrier layer disposed on the substrate is reduced and/or adsorbs the reductant to form a conditioned layer for the subsequent nucleation layer. In one example performed prior to an ALD nucleation process, about 300 sccm of a 5 vol % diborane in hydrogen is exposed to the substrate for about 30 seconds at about 15 Torr and about 350° C. In another example performed prior to an ALD nucleation process, about 300 sccm of a 5 vol % diborane in hydrogen and about 2 slm of hydrogen are exposed to the substrate for about 20 seconds at about 10 Torr and about 300° C. In one example performed prior to a pulsed-CVD nucleation process, about 200 sccm of a 5 vol % diborane in hydrogen is exposed to the substrate for about 24 seconds at about 90 Torr and about 400° C.

During step 230, a nucleation layer is deposited on the substrate surface, namely on the treated barrier layer. The nucleation layer may be deposited by a vapor deposition process that includes ALD, CVD, and/or pulsed-CVD. The process chamber used to deposit the nucleation layer may be the same process chamber used in the soak processes as described in steps 220 and 240. The nucleation layer may contain tungsten, tungsten alloys, tungsten-containing materials (e.g., tungsten boride or tungsten silicide) and combinations thereof. The nucleation layer is typically deposited to a thickness within the range from about 2 Å to about 200 Å. In one example, an ALD process utilizing $WF_6$ and $B_2H_6$ deposits a nucleation layer with a thickness within the range from about 2 Å to about 20 Å, such as about 12 Å. In another example, an ALD process utilizing $WF_6$ and $SiH_4$ deposits a nucleation layer with a thickness within the range from about 2 Å to about 50 Å, such as about 30 Å. In another example, a pulsed-CVD (e.g., co-flowed) process utilizing $WF_6$ and $SiH_4$ or $WF_6$ and $B_2H_6$ deposits a nucleation layer with a thickness within the range from about 2 Å to about 200 Å, such as about 50 Å. Preferably, the ALD process as described herein during process 100 may be used to deposit the nucleation layer.

During step 240, the substrate surface is exposed to a post-soak process or a second soak process containing a reductant and an optional carrier gas. The reductant adsorbs and/or reacts to the substrate surface, namely the nucleation layer, to form a treated surface. The reductant or reducing compound, as described above, may also include silane compounds, borane compounds, phosphine compounds, ammonia, amine compounds, hydrogen, derivatives thereof, mixtures thereof, or combinations thereof. A carrier gas may be co-flowed with the reductant or reducing compound and include hydrogen, nitrogen, argon, or combinations thereof.

The substrate may be exposed to the post-soak gas or reducing gas during the post-soak process in step 240 for a time period within the range from about 1 second to about 90 seconds, preferably, from about 5 seconds to about 60 seconds, more preferably, from about 10 seconds to about 30 seconds, and more preferably, from about 15 seconds to about 20 seconds. In one embodiment, the substrate surface may be exposed to a post-soak gas while the substrate is heated to a temperature within the range from about 100° C. to about 600° C., preferably, from about 200° C. to about 600° C., more preferably, from about 300° C. to about 500° C., more preferably, from about 350° C. to about 420° C., and more preferably, from about 375° C. to about 500° C. during a post-soak process. The process chamber is maintained having internal pressure within the range from about 1 Torr to about 150 Torr, preferably, from about 1 Torr to about 100 Torr, more preferably, from about 10 Torr to about 50 Torr, and more preferably, from about 20 Torr to about 40 Torr. The barrier layer disposed on the substrate is reduced and/or adsorbs the reductant to form a conditioned layer for the subsequent bulk layer.

The substrate is exposed to a soak gas (e.g., post-soak gas) or a reducing gas which contains hydrogen gas and a hydride compound, such as silane, disilane, borane, diborane, phosphine, derivatives thereof, or combinations thereof. In one embodiment, the reducing gas contains a hydrogen/hydride flow rate ratio of about 40:1 or greater, preferably, about 100:1 or greater, more preferably, about 500:1 or greater, and more preferably, about 800:1 or greater. The hydride compound (e.g., diborane) may have a flow rate within a range from about 1 sccm to about 40 sccm, preferably, from about 3 sccm to about 30 sccm, and more preferably, from about 5 sccm to about 15 sccm. The reducing gas contains hydrogen gas having a flow rate within a range from about 1 slm to about 20 slm, preferably, from about 3 slm to about 15 slm, and more preferably, from about 5 slm to about 10 slm.

In one example performed after an ALD nucleation process, about 300 sccm of a 5 vol % diborane in hydrogen may be exposed to the substrate for about 30 seconds at about 30 Torr and about 300° C. In another example performed after a pulsed-CVD nucleation process, about 200 sccm of a 5 vol % diborane in hydrogen and about 3 slm of hydrogen are exposed to the substrate for about 30 seconds at about 15 Torr and about 400° C. In another example performed after a pulsed-CVD nucleation process, about 300 sccm of a 5 vol % diborane in diborane is exposed to the substrate for about 20 seconds at about 90 Torr and about 400° C.

During step 250, a bulk layer is deposited on the substrate surface, namely on the treated nucleation layer. The bulk layer may be deposited by a vapor deposition process that includes CVD or pulsed-CVD. The process chamber used to deposit the bulk layer may be the same process chamber used in the post soak process as described in step 240. The bulk layer contains tungsten, tungsten alloys, tungsten-containing materials, (e.g., tungsten boride, tungsten silicide, or tungsten phosphide) and combinations thereof. The bulk layer is typically deposited to a thickness within the range from about 100 Å to about 10,000 Å, preferably, from about 1,000 Å to about 5,000 Å. In one example, a CVD process utilizing $WF_6$ and $B_2H_6$ is used to deposit a bulk layer on the treated nucleation layer. In another example, a CVD process utilizing $WF_6$ and $SiH_4$ is used to deposit a bulk layer on the treated nucleation layer. In another example, a PVD process utilizing a tungsten source is used to deposit a bulk layer on the treated nucleation layer. A process for soaking a tungsten nucleation layer and depositing a tungsten bulk layer thereon is further described in the commonly assigned U.S. Pat. No. 6,156,382, which is incorporated by reference herein.

In an alternative embodiment, a tungsten-containing film is deposited by depositing more than one nucleation layer and may include multiple cycles of a vapor deposition process. In one example, the barrier layer may be exposed to a soak process prior to forming a first nucleation layer by a pulsed-CVD process. The process chamber is heated to a temperature within a range from about 400° C. to about 450° C., for example, about 425° C. and maintained at a pressure within a range from about 10 Torr to about 20 Torr, such as about 15 Torr. The pulsed-CVD process may include exposing the substrate to a co-flow of a tungsten-containing compound and a reductant for a period of time from about 1 second to about 3 seconds, for example about 1.5 seconds. The flow of the reagents include the tungsten-containing compound with a flow rate from about 30 sccm to about 90 sccm, such as about 60 sccm, while the reductant is at a flow rate from about 10 sccm to about 50 sccm, such as about 30 sccm. The co-flow is stopped and the process chamber purged. Then the reductant is pulsed into the chamber for a period of time from about 1 second to about 3 seconds, for example about 1 second. The reductant may have a flow rate from about 10 sccm to about 50 sccm, such as about 30 sccm. The flow of the reductant is stopped and the chamber purged for about 0.5 seconds. The cycle is repeated until a predetermined thickness of the first nucleation layer is formed. For example, the process is repeated 3 times to form a layer with a thickness about 30 Å. The preferred tungsten-containing compound is tungsten hexafluoride and the preferred reductant is silane and/or diborane. The reductant is optionally used during a soak process prior or subsequent the deposition of the first nucleation layer.

A second nucleation layer may be formed on the first nucleation layer. The process chamber may be kept at the same temperature, but the pressure of the process chamber is usually increased. The process chamber is maintained at a temperature within the range from about 400° C. to about 450° C., for example, about 425° C. and the a pressure is within the range from about 20 Torr to about 50 Torr, such as about 30 Torr. The CVD process may include exposing the substrate to a co-flow of a tungsten-containing compound and a reductant for a period of time from about 4 seconds to about 8 seconds, for example about 6 seconds. The flow of the reagents include the tungsten-containing compound with a flow rate from about 30 sccm to about 70 sccm, such as about 50 sccm, while the reductant has a flow rate from about 10 sccm to about 50 sccm, such as about 25 sccm. A second nucleation layer is deposited on the first nucleation layer and has a thickness within the range from about 50 Å to about 1,000 Å, preferably, from about 150 Å to about 300 Å. The preferred tungsten-containing compound is tungsten hexafluoride and the preferred reductant is silane and/or diborane. The reductant is optionally used during a soak process prior or subsequent the deposition of the second nucleation layer.

Finally, a bulk layer may be deposited on the second nucleation layer. The bulk layer may be deposited by a tradition CVD process. In one example, the process chamber is maintained at a temperature within the range from about 400° C. to about 450° C., for example, about 425° C. and the pressure is maintained within the range from about 100 Torr to about 350 Torr, such as about 200 Torr. The flow of the reagents include the tungsten-containing compound with a flow rate from about 200 sccm to about 800 sccm, such as about 400 sccm, while the reductant has a flow rate from about 2,000 sccm to about 8,000 sccm, such as about 4,000 sccm. The preferred tungsten-containing compound is tungsten hexafluoride and the preferred reductant is hydrogen.

Process Integration

A tungsten nucleation layer as described above has shown particular utility when integrated with traditional bulk fill techniques to form features with excellent film properties. An integration scheme can include ALD or pulsed-CVD processes to deposit a nucleation layer while a bulk layer may be deposited by CVD or PVD processes. Integrated processing systems capable of performing such an integration scheme include an ENDURA®, ENDURA SL®, CENTURA® and PRODUCER® processing system, each available from Applied Materials, Inc., located in Santa Clara, Calif. Any of these systems may be configured to include at least one ALD or pulsed-CVD chamber for depositing the nucleation layer, at least one CVD chamber for depositing bulk fill, and/or at least one PVD chamber for additional materials.

Figure 3A:
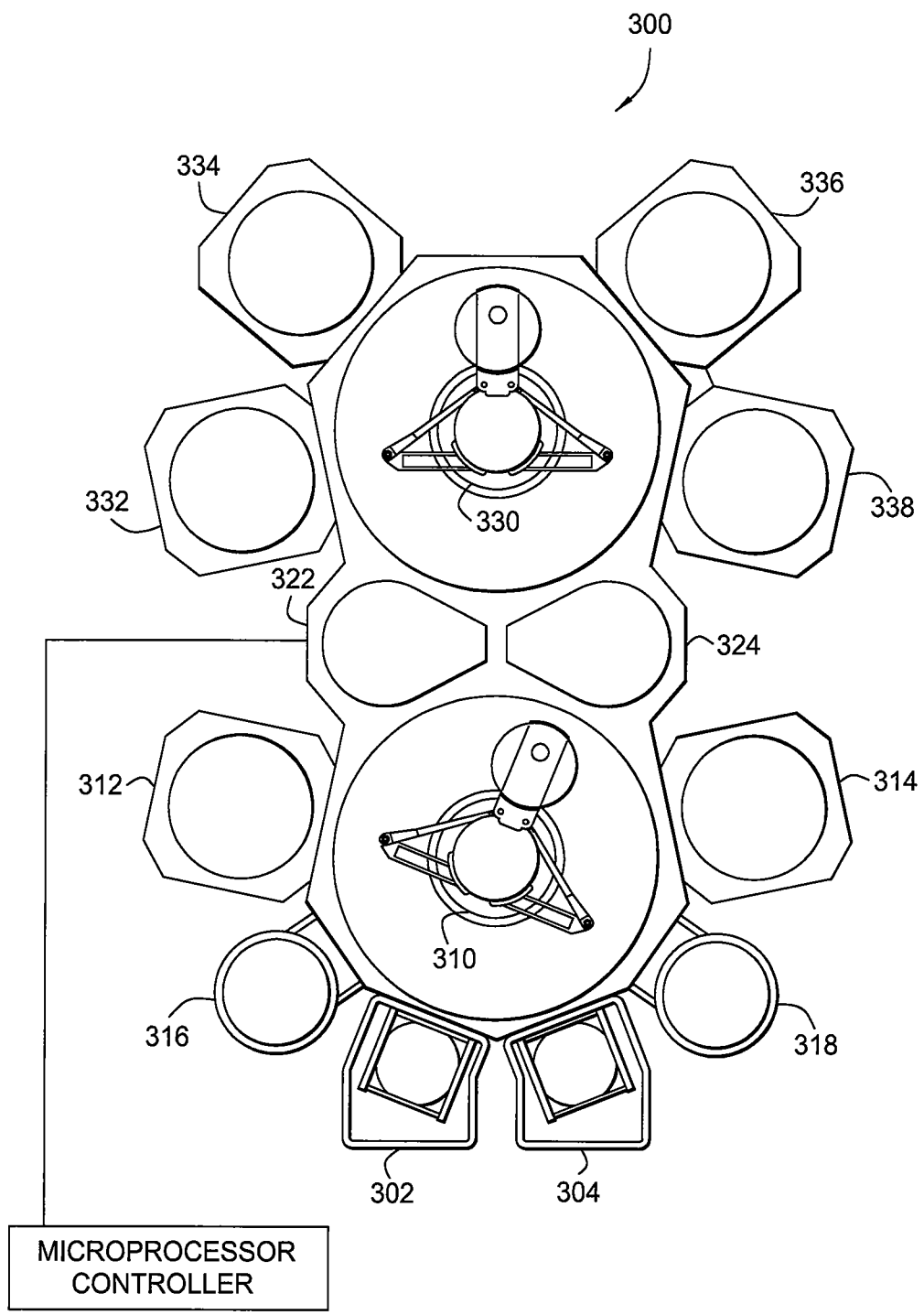
FIG. 3A shows an exemplary integrated processing platform.

FIG. 3A is a schematic top-view diagram of an exemplary multi-chamber processing system 300. A similar multi-chamber processing system is disclosed in commonly assigned U.S. Pat. No. 5,186,718, which is incorporated by reference herein. The system 300 generally includes load lock chambers 302, 304 for the transfer of substrates into and out from the system 300. Typically, since the system 300 is under vacuum, the load lock chambers 302, 304 may "pump down" the substrates introduced into the system 300. A first robot 310 may transfer the substrates between the load lock chambers 302, 304, and a first set of one or more substrate processing chambers 312, 314, 316, 318 (four are shown). Each processing chamber 312, 314, 316, 318, can be outfitted to perform a number of substrate processing operations such as cyclical layer deposition, CVD, PVD, etch, pre-clean, de-gas, orientation, and other substrate processes. The first robot 310 also transfers substrates to/from one or more transfer chambers 322, 324.

The transfer chambers 322, 324, are used to maintain ultra-high vacuum conditions while allowing substrates to be transferred within the system 300. A second robot 330 may transfer the substrates between the transfer chambers 322, 324 and a second set of one or more processing chambers 332, 334, 336, 338. Similar to processing chambers 312, 314, 316, 318, the processing chambers 332, 334, 336, 338 may be outfitted to perform a variety of substrate processing operations, such as cyclical deposition, CVD, PVD, etch, pre-clean, de-gas, and orientation, for example. Any of the substrate processing chambers 312, 314, 316, 318, 332, 334, 336, 338 may be removed from the system 300 if not necessary for a particular process to be performed by the system 300.

In one arrangement, each processing chamber 332 and 338 may be a cyclical deposition chamber adapted to deposit a nucleation layer; each processing chamber 334 and 336 may be a cyclical deposition chamber, a chemical vapor deposition chamber or a physical vapor deposition chamber adapted to form a bulk layer; each processing chamber 312 and 314 may be a physical vapor deposition chamber, a chemical vapor deposition chamber, or a cyclical deposition chamber adapted to deposit a dielectric layer; and each processing chamber 316 and 318 may be an etch chamber outfitted to etch apertures or openings for interconnect features. This one particular arrangement of the system 300 is provided to illustrate the invention and should not be used to limit the scope of the invention.

Another integrated system may include nucleation deposition as well as bulk fill deposition in a single chamber. A chamber configured to operate in both a cyclical deposition mode as well as a conventional CVD mode can be used. One example of such a chamber is described in commonly assigned U.S. Pat. No. 6,878,206, which is incorporated herein by reference.

In another integration scheme, one or more cyclical deposition nucleation chambers are integrated onto a first processing system while one or more bulk layer deposition chambers are integrated onto a second processing system. In this configuration, substrates are first processed in the first system where a nucleation layer is deposited on a substrate. Thereafter, the substrates are moved to the second processing system where bulk deposition occurs.

Figure 3B:
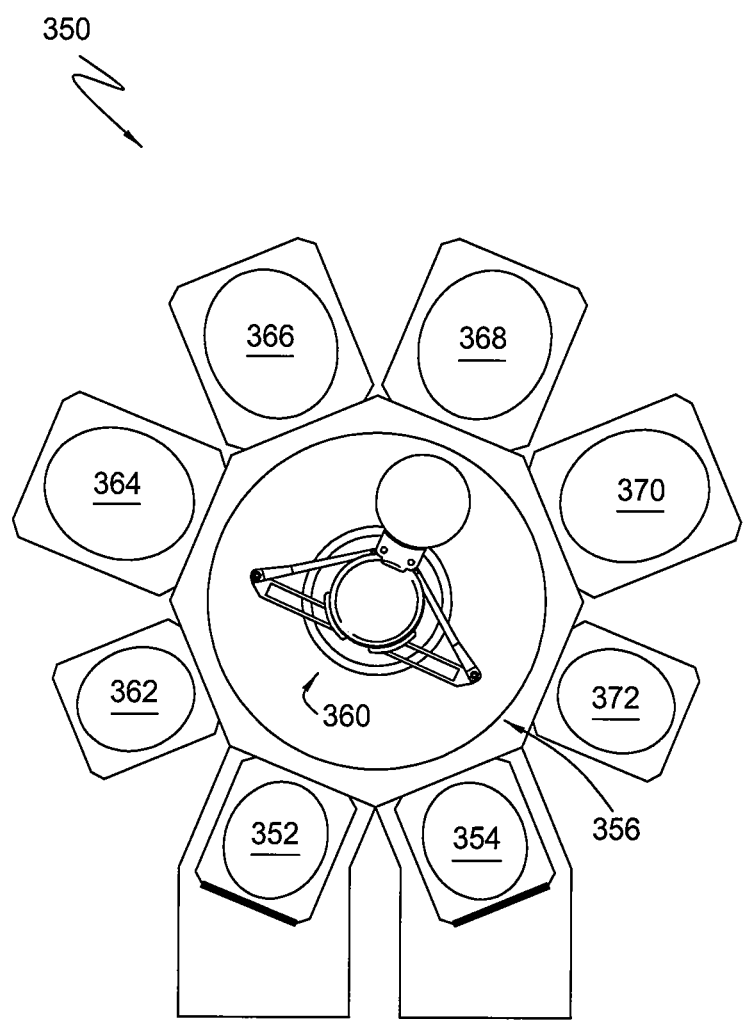
FIG. 3B shows another exemplary integrated processing platform.

FIG. 3B is a schematic top-view diagram of an exemplary multi-chamber processing system 350. The system 350 generally includes load lock chambers 352, 354 for the transfer of substrates into and out from the system 350. Typically, since the system 350 is under vacuum, the load lock chambers 352, 354 may "pump down" the substrates introduced into the system 350. A robot 360 may transfer the substrates between the load lock chambers 352, 354, and substrate processing chambers 362, 364, 366, 368, 370, and 372. Each processing chamber 362, 364, 366, 368, 370, and 372 can be outfitted to perform a number of substrate processing operations such as cyclical layer deposition, CVD, PVD, etch, pre-clean, de-gas, heat, orientation and other substrate processes. The robot 360 also transfers substrates to/from a transfer chamber 356. Any of the substrate processing chambers 362, 364, 366, 368, 370, and 372 may be removed from the system 350 if not necessary for a particular process to be performed by the system 350.

In one arrangement, each processing chamber 364 and 370 may be a cyclical deposition chamber adapted to deposit a nucleation layer, each processing chamber 366 and 368 may be a cyclical deposition chamber, a chemical vapor deposition chamber or a physical vapor deposition chamber adapted to form a bulk fill deposition layer. This one particular arrangement of the system 350 is provided to illustrate the invention and should not be used to limit the scope of the invention.

Alternatively, a carousel type batch processing system having a plurality of stations in a single chamber can be adapted to incorporate nucleation and bulk layer deposition into a single processing system. In such a processing system a purge gas curtain, such as an argon gas curtain, can be established between each station creating a micro or mini environment at each station. The substrates are loaded into the system sequentially and then rotated through each station and processed at least partially at each station. For example, a substrate may be exposed to a cyclical deposition nucleation step at a first station and then to partial bulk fill CVD steps at each of the subsequent stations. Alternatively, nucleation may occur at more than one station and bulk fill may occur at one or more stations. Still further, the nucleation layer and the bulk layer may be deposited in separate carousel type systems. In another aspect, the soak and the nucleation steps are completed in one carousel while the bulk steps are done on another carousel, wherein both carousels are part of the same process system. Each platen can be temperature controlled to provide at least some process control at each station. However, the process pressure typically remains the same between stations because the stations are housed in a single chamber. Some pressure control may be available in a micro or mini environment present at each station due to the inert gas curtain.

Regardless of the integration scheme, the nucleation layer may have a thickness within the range from about 2 Å to about 200 Å, for example, from about 5 Å to about 100 Å. In some examples, the nucleation layer may have a thickness of about 50 Å or less, such as about 30 Å or less, preferably, about 20 Å or less, more preferably, about 15 Å or less, such as about 10 Å or less. The bulk layer may have a thickness within the range from about 100 Å to about 10,000 Å, for example, from about 1,000 Å to about 5,000 Å. However, the thickness of these films can vary depending on the feature sizes and aspect ratios of a given application. Accordingly, the films are suitably sized to accommodate the geometries of a given application. The following are some exemplary geometries and applications that can benefit from a nucleation layer deposited according to embodiments described herein. The following descriptions are intended for illustrative purposes only, and are not intended to limit the uses of the present invention.

The tungsten bulk layer may be deposited by a traditional CVD process, such as by co-flowing tungsten hexafluoride and hydrogen gas into the process chamber. The tungsten bulk layer may have a resistivity measured across the substrate of about 20 $\mu\Omega$-cm or less, preferably, about 16 $\mu\Omega$-cm or less, more preferably about 14 $\mu\Omega$-cm or less, such as about 10 $\mu\Omega$-cm or less, preferably, about 9 $\mu\Omega$-cm or less, more preferably, about 8 $\mu\Omega$-cm or less, and more preferably, about 7 $\mu\Omega$-cm or less.

Figure 4A:
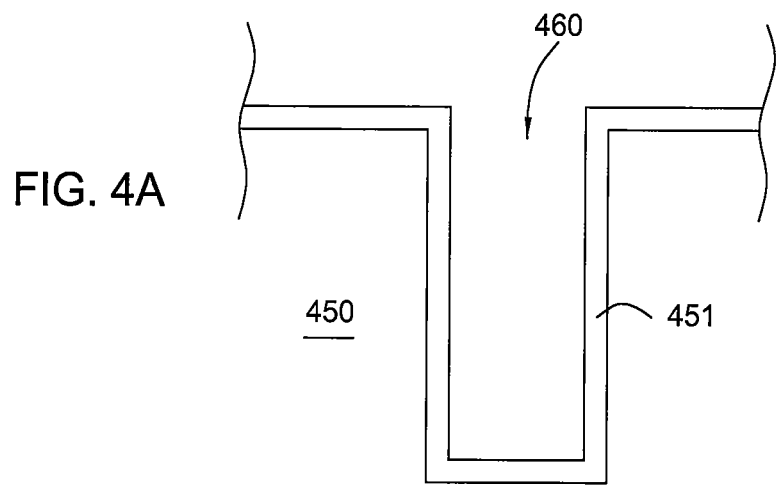
FIGS. 4A-4C show cross sectional views of a via, a nucleated via and a filled via.
Figure 4B:
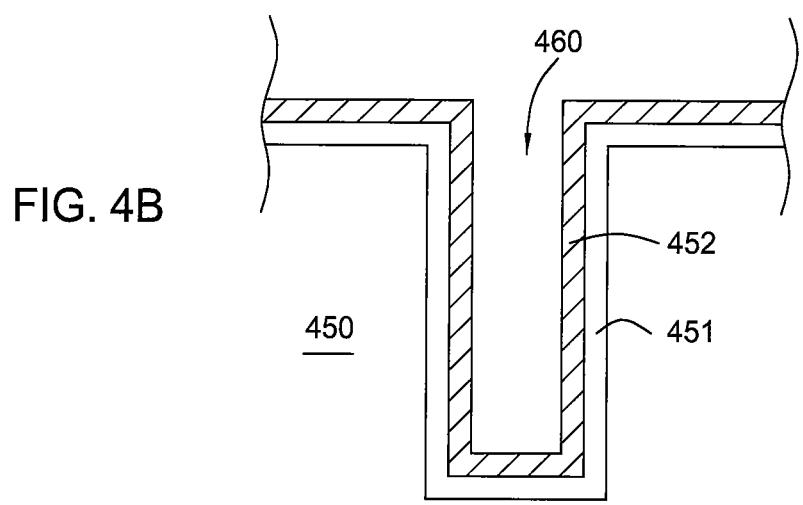
Figure 4C:
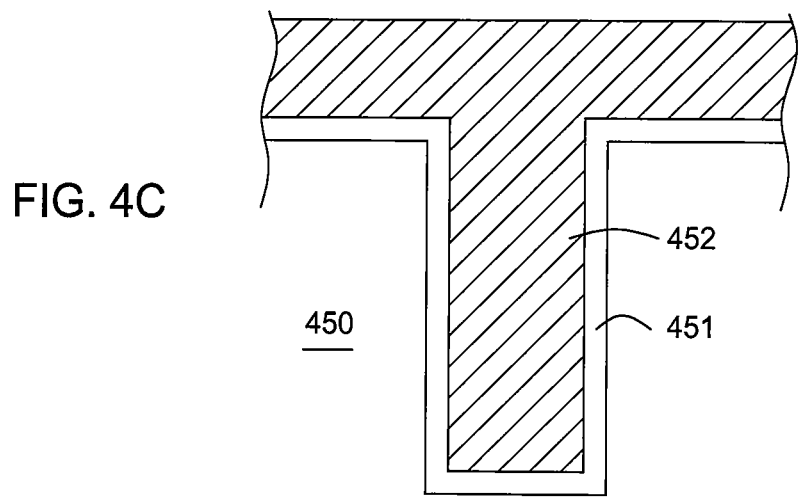

FIGS. 4A-4C show cross sectional views of a semiconductor feature that one embodiment of the process is utilized to fill a via 460. In FIG. 4A, the substrate 450 includes at least one via 460. A barrier layer 451 may be deposited by ALD, CVD or PVD techniques to the substrate 450 with via 460. Barrier layer 451 may contain titanium, titanium nitride, tantalum, tantalum nitride, tungsten, tungsten nitride, borides thereof, silicides thereof, alloys thereof, or combinations thereof. Prior to the nucleation of a tungsten layer 452, as depicted in FIG. 4B, a soak process may be administered to barrier layer 451. The soak process renders the sidewalls, of the barrier layer 451 within the via 460, to adhere and grow the tungsten layer 452 at about the same rate as the barrier layer 451 outside the via 460. When the soak process is omitted, growth of tungsten layer 452 on the sidewalls is not constant with respect to the growth of tungsten layer 452 outside the via 460. Once the nucleation of tungsten layer 452 has been deposited, then a secondary soak or post soak process is conducted to treat tungsten layer 452. The post soak process provides tungsten layer 452 to more smoothly continue growth while filling the via 460, as demonstrated in FIG. 4C. In one example, an ALD process is continued after deposition of a tungsten nucleation layer to deposit the tungsten bulk layer. In another example, an ALD process is used to deposit the tungsten nucleation layer and a CVD process is used to deposit the tungsten bulk layer. In another example, an ALD process is used to deposit the tungsten nucleation layer and a PVD process is used to deposit the tungsten bulk layer. In another example, a pulsed-CVD process is used to deposit the tungsten nucleation layer and a conventional CVD process is used to deposit the tungsten bulk layer. In another example, a pulsed-CVD process is used to deposit the tungsten nucleation layer and a PVD process is used to deposit the tungsten bulk layer.

Tungsten Metal Gate

Figure 5:
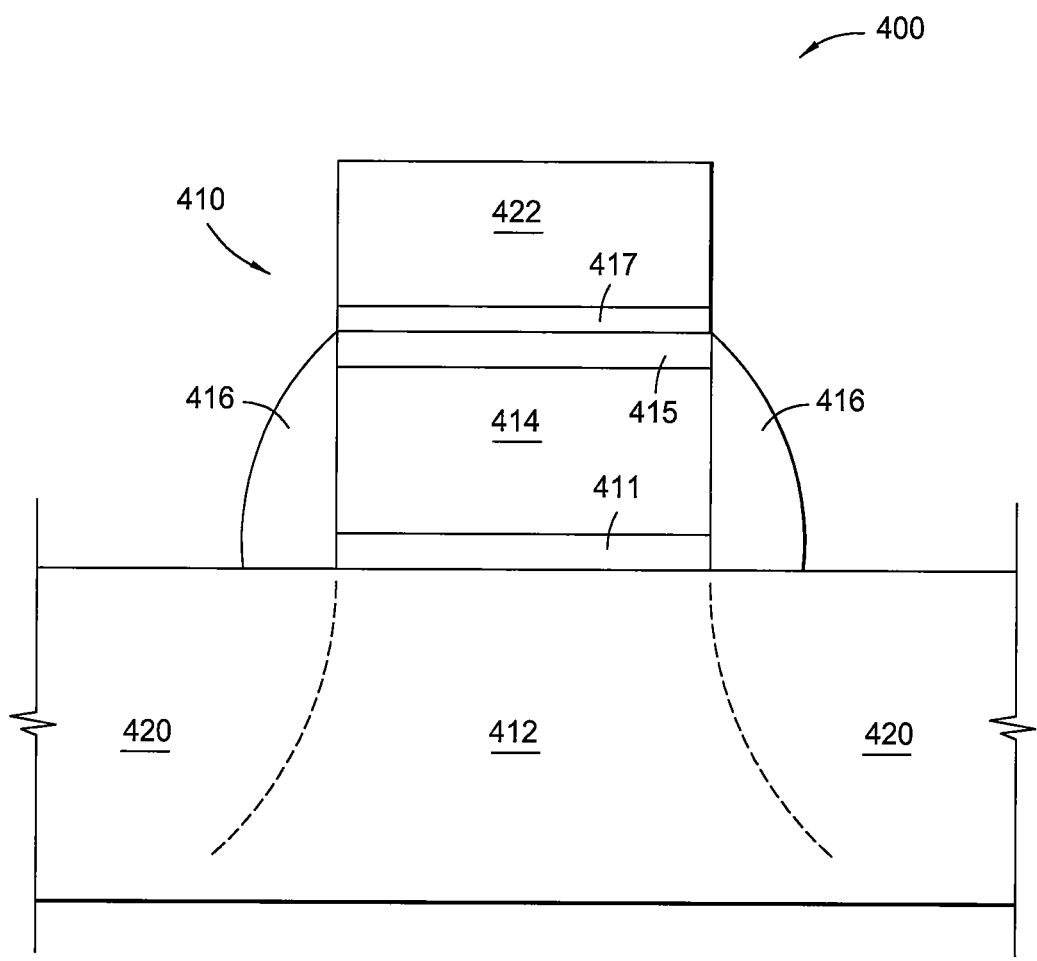
FIG. 5 shows a cross sectional view of an exemplary metal oxide gate device formed according to an embodiment of the invention.

FIG. 5 shows a cross sectional view of an exemplary metal oxide gate device 400 utilizing a nucleation layer deposited according to embodiments described herein. The device 400 generally includes an exposed gate 410 surrounded by spacers 416 and silicon source/drain areas 420 formed within a substrate surface 412. The spacers 416 typically include an oxide, such as silicon dioxide, or a nitride, such as silicon nitride.

The metal gate 410 includes an oxide layer 411, a polysilicon layer 414, a titanium nitride barrier layer 415 and a tungsten layer 422. The oxide layer 411 separates the substrate 412 from the polysilicon layer 414. The oxide layer 411 and the polysilicon layer 414 are deposited using conventional deposition techniques.

The titanium nitride barrier layer 415 is deposited on the polysilicon layer 414. The titanium nitride barrier layer 415 may be a bi-layer stack formed by depositing a PVD titanium layer followed by a CVD titanium nitride layer. The titanium nitride barrier layer 415 may also be deposited using a cyclical deposition technique, such as the process shown and described in commonly assigned U.S. Ser. No. 10/032,293, filed on Dec. 21, 2001, and published as US 2003-0116087, now abandoned, which is herein incorporated by reference.

A soak process is administered to the substrate surface. The soak includes a silane compound or a borane compound along with at least one carrier gas. A preferred silane compound is silane, a preferred borane compound is diborane and a preferred carrier gas is hydrogen, nitrogen, and/or argon. In one aspect, silane has a flow rate within the range from about 25 sccm to about 500 sccm and hydrogen has a flow rate within the range from about 200 sccm to about 700 sccm. The soak process is conducted at a temperature within the range from about 100° C. to about 500° C., preferably at about 300° C., a pressure within the range from about 1 Torr to about 150 Torr, preferably, from about 30 Torr to about 120 Torr and for a time period from about 1 second to about 90 seconds. In another aspect, diborane has a flow rate within the range from about 25 sccm to about 500 sccm and hydrogen and/or argon has a flow rate within the range from about 200 sccm to about 700 sccm. The soak process is conducted at a temperature within the range from about 100° C. to about 500° C., preferably at about 300° C., a pressure within the range from about 1 Torr to about 120 Torr, preferably, from about 5 Torr to about 50 Torr, and a period of time from about 1 second to about 90 seconds, preferably less than about 60 seconds.

In one example, a nucleation layer 417 is then cyclically deposited over the barrier layer 415 following treatment of the substrate surface with a soak process. In one aspect, the nucleation layer 417 is cyclically deposited using alternating pulses of tungsten hexafluoride and diborane. The tungsten hexafluoride may be pulsed into the chamber and the substrate is exposed at a rate of within a range from about 1 sccm to about 100 sccm, preferably, from about 5 sccm to about 50 sccm, for about 0.3 seconds. A carrier gas, such as argon, is provided along with the tungsten hexafluoride at a flow rate within a range from about 100 sccm to about 1,000 sccm, preferably from about 100 sccm to about 500 sccm. The diborane (e.g., 5% in $H_2$) may be pulsed into the chamber and the substrate is exposed at a rate of within a range from about 50 sccm to about 1,000 sccm, preferably, from about 100 sccm to about 400 sccm, for about 0.3 seconds. Hydrogen gas may be pulsed into the chamber and the substrate is exposed at a rate of within a range from about 1 slm to about 20 slm, preferably, from about 3 slm to about 15 slm, and more preferably, from about 5 slm to about 10 slm. The substrate may be maintained at a temperature between about 100° C. and about 400° C., preferably at about 300° C., at a chamber pressure between about 1 Torr and about 120 Torr, preferably between about 5 Torr and about 50 Torr. In between pulses of the tungsten hexafluoride and the diborane, hydrogen is pulsed for about 0.5 seconds to purge or otherwise remove any reactive compounds from the processing chamber.

In another example, the nucleation layer 417 is cyclically deposited using alternating pulses of tungsten hexafluoride and silane. The tungsten hexafluoride is pulsed as described above with argon for about 0.5 seconds. The silane is pulsed at a rate of about 1 sccm to about 100 sccm, such as between about 5 sccm to about 50 sccm, for about 0.5 seconds. A carrier gas, such as hydrogen, is provided along with the silane at a rate of about 100 sccm and about 1,000 sccm, such as between about 100 sccm and about 500 sccm. Hydrogen gas may be pulsed into the chamber and the substrate is exposed at a rate of within a range from about 1 slm to about 20 slm, preferably, from about 3 slm to about 15 slm, and more preferably, from about 5 slm to about 10 slm. The substrate is maintained at a temperature between about 100° C. and about 400° C., preferably at about 300° C., at a chamber pressure between about 1 Torr and about 30 Torr.

In another example, a nucleation layer 417 is deposited by a pulsed-CVD process on the barrier layer 415 following treatment of the substrate surface with a soak process. The pulsed-CVD process includes co-flowing $WF_6$ and $B_2H_6$ or $WF_6$ and $SiH_4$ at a temperature within the range from about 300° C. to about 500° C., preferably, from about 400° C. to about 450° C. The pulsed-CVD process pulses the co-flowing precursors at a time period from about 0.5 seconds to about 3 seconds, preferably about 1.5.

A second soak process or post soak process is administered to the substrate surface. The soak process includes a reductant, such as silane compound or a borane compound along with at least one carrier gas. Preferably, the reductant is diborane and a preferred carrier gas is hydrogen, nitrogen and/or argon. In one example, a reducing gas containing 5 vol % of diborane in hydrogen has a flow rate within the range from about 100 sccm to about 500 sccm, preferably about 300 sccm. In some examples, the substrate may be exposed to hydrogen gas having a flow rate within a range from about 1 slm to about 20 slm, preferably, from about 3 slm to about 15 slm, and more preferably, from about 5 slm to about 10 slm along with the reducing gas. The soak process is conducted at a temperature within the range from about 100° C. to about 500° C., preferably about 300° C., a pressure within the range from about 1 Torr to about 120 Torr, preferably, from about 10 Torr to about 50 Torr, and for a time period from about 1 second to about 90 seconds, preferably less than about 30 seconds.

A nucleation layer formed utilizing soak processes has advantages over a nucleation layer formed without the soak processes. The tungsten film shows less stress for the integrated film, as well as, less fluorine content at the interface of the nucleation layer. Also, the nucleation layer deposited post a soak treatment has higher uniformity coverage and is deposited quicker due to a reduced incubation period.

A tungsten bulk fill 422 is then deposited on the treated tungsten nucleation layer 417. Although any metal deposition process, such as conventional chemical vapor deposition or physical vapor deposition, may be used, the tungsten bulk fill 422 may be deposited by alternately adsorbing a tungsten-containing compound and a reducing compound as described above. A more detailed description of tungsten deposition using a cyclical deposition technique may be found in commonly assigned U.S. Pat. No. 6,878,206, and in commonly assigned U.S. Ser. No. 10/082,048, filed on Feb. 20, 2002, and published as US 2003-0157760, now abandoned, which are both incorporated herein by reference in their entirety. Fewer volcanoes appear on the surface of the tungsten film deposited utilizing a soak process, as compared to tungsten films deposited without exploiting a soak process, post tungsten bulk-fill.

Following deposition, the top portion of the resulting structure 400 may be planarized. A chemical mechanical polishing (CMP) apparatus may be used, such as the MIRRA® System available from Applied Materials, Inc., located in Santa Clara, Calif. Portions of the tungsten bulk fill 422 are removed from the top of the structure leaving a fully planar surface. Optionally, the intermediate surfaces of the structure may be planarized between the depositions of the subsequent layers described above.

Figure 6:
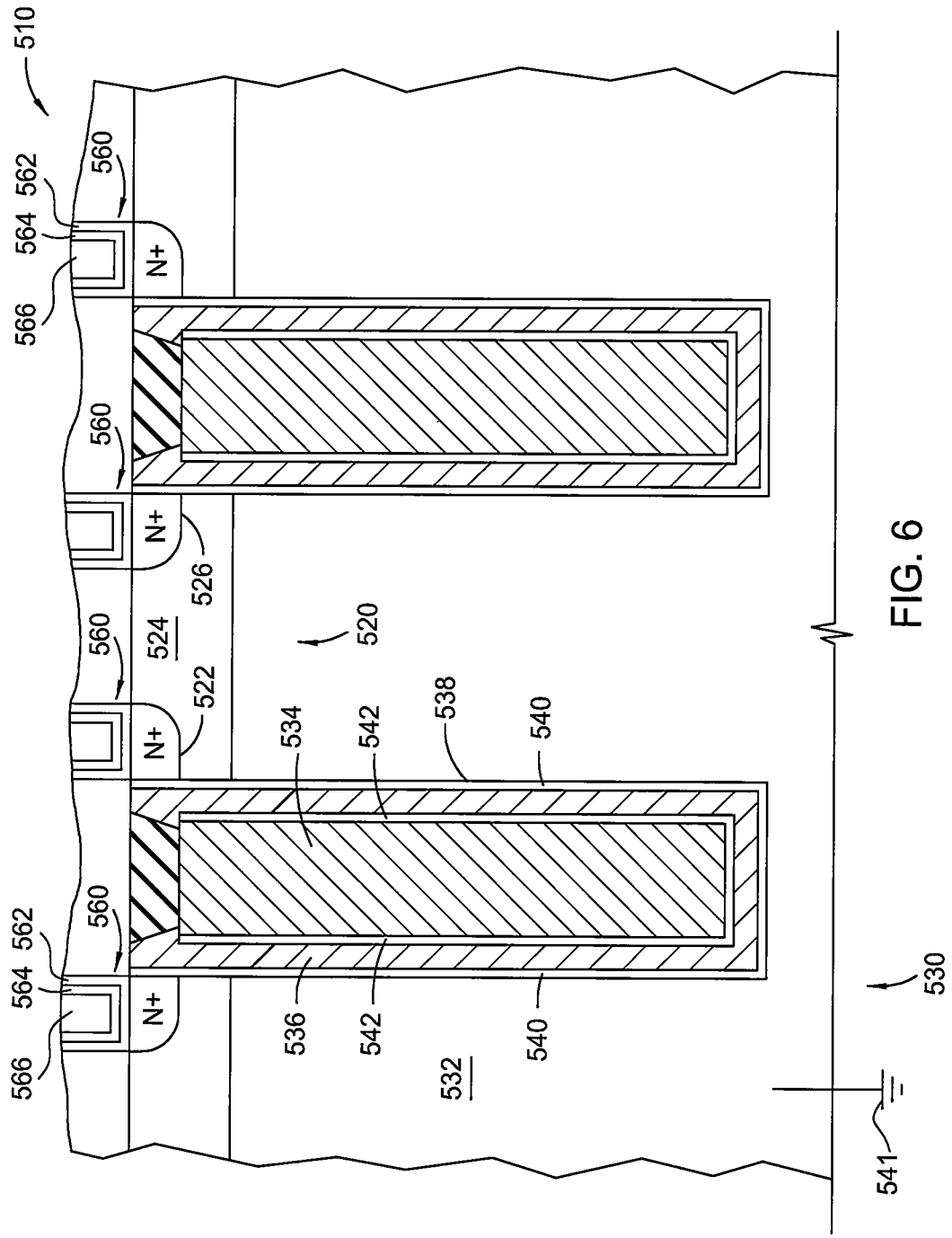
FIG. 6 shows a cross sectional view of a conventional DRAM device formed according to an embodiment of the invention.

FIG. 6 is a cross sectional view of a conventional DRAM device having a transistor 520 positioned adjacent a top portion of a trench capacitor 530. The access transistor 520 for the DRAM device 510 is positioned adjacent a top portion of the trench capacitor 530. Preferably, the access transistor 520 contains an n-p-n transistor having a source region 522, a gate region 524 and a drain region 526. The gate region 524 is a P– doped silicon epi-layer disposed over the P+ substrate. The source region 522 of the access transistor 520 is an N+ doped material disposed on a first side of the gate region 524 and the drain region 526 is an N+ doped material disposed on a second side of the gate region 524, opposite the source region 522.

The source and drain regions 522, 524 may be connected to a tungsten plug 560. Each tungsten plug 560 includes a titanium liner 562, a tungsten nucleation layer 564, and a bulk tungsten fill 566. The titanium liner 562 may be a bi-layer stack containing PVD titanium followed by CVD titanium nitride. Alternatively, the titanium liner 562 may be a bi-layer stack containing ALD deposited titanium followed by ALD deposited titanium nitride. The tungsten nucleation layer 564 is formed by using a soak process and an ALD process or a soak process and a pulsed-CVD process as described above. The tungsten bulk fill 566 may be deposited using a post soak process and any conventional deposition techniques, including CVD.

The trench capacitor 530 generally includes a first electrode 532, a second electrode 534 and a dielectric material 536 disposed therebetween. The P+ substrate serves as a first electrode 532 of the trench capacitor 530 and is connected to a ground connection 541. A trench 538 is formed in the P+ substrate and filled with a heavily doped N+ polysilicon that serves as the second electrode 534 of the trench capacitor 530. The dielectric material 536 is disposed between the first electrode 532 (i.e., P+ substrate) and the second electrode 534 (i.e., N+ polysilicon).

The trench capacitor 530 also includes a first tungsten nitride barrier layer 540 disposed between the dielectric material 536 and the first electrode 532. Preferably, a second tungsten nitride barrier layer 542 is disposed between the dielectric material 536 and the second electrode 534. Alternatively, the barrier layers 540, 542 are a combination film, such as W/WN.

Although the above-described DRAM device utilizes an n-p-n transistor, a P+ substrate as a first electrode, and an N+ polysilicon as a second electrode of the capacitor, other transistor designs and electrode materials are contemplated by the present invention to form DRAM devices. Additionally, other devices, such as crown capacitors for example, are contemplated by embodiments described herein.

"Substrate surface" or "substrate," as used herein, refers to any substrate or material surface formed on a substrate upon which film processing is performed during a fabrication process. For example, a substrate surface on which processing may be performed include materials such as monocrystalline, polycrystalline or amorphous silicon, strained silicon, silicon on insulator (SOI), doped silicon, silicon germanium, germanium, gallium arsenide, glass, sapphire, silicon oxide, silicon nitride, silicon oxynitride, and/or carbon doped silicon oxides, such as $SiO_xC_y$, for example, BLACK DIAMOND® low-k dielectric, available from Applied Materials, Inc., located in Santa Clara, Calif. Substrates may have various dimensions, such as 200 mm or 300 mm diameter wafers, as well as, rectangular or square panes. Unless otherwise noted, embodiments and examples described herein are preferably conducted on substrates with a 200 mm diameter or a 300 mm diameter, more preferably, a 300 mm diameter. Embodiments of the processes described herein deposit metallic tungsten, tungsten nitride, tungsten boride, tungsten silicide, derivatives thereof, alloys thereof, and other tungsten-containing materials on many substrates and surfaces, especially, on barrier layers, adhesion layers, or conductive layers. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, and patterned or non-patterned wafers. Substrates may be exposed to a pre-treatment process to polish, etch, reduce, oxidize, hydroxylate, anneal, and/or bake the substrate surface.

"Atomic layer deposition" or "cyclical deposition" as used herein refers to the sequential introduction of two or more reactive compounds to deposit a layer of material on a substrate surface. The two, three or more reactive compounds may alternatively be introduced into a reaction zone of a process chamber. Usually, each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. During each time delay a purge gas, such as nitrogen, is introduced into the process chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. In alternative embodiments, the purge gas may also be a reducing agent, such as hydrogen, diborane, or silane. The reactive compounds are alternatively pulsed until a desired film or film thickness is formed on the substrate surface. In either scenario, the ALD process of pulsing compound A, purge gas, pulsing compound B and purge gas is a cycle. A cycle can start with either compound A or compound B and continue the respective order of the cycle until achieving a film with the desired thickness. In another embodiment, a first precursor containing compound A, a second precursor containing compound B, and a third precursor containing compound C are each separately and alternatively pulsed into the process chamber. Alternatively, a first precursor containing compound A and a second precursor containing compound B are each separately and alternatively pulsed into the process chamber while, and a third precursor containing compound C is continuously flowed into the process chamber. Alternatively, a pulse of a first precursor may overlap in time with a pulse of a second precursor while a pulse of a third precursor does not overlap in time with either pulse of the first and second precursors.

A "pulse" as used herein is intended to refer to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the process chamber employed, the vacuum system coupled thereto, and the volatility/reactivity of the particular compound itself. A "half-reaction" as used herein to refer to a pulse of a precursor followed by a purge step.

EXAMPLES

The following examples were conducted to substrates that contained a barrier layer deposited on the surface. The barrier layer was formed by first depositing a titanium layer by a PVD process on a 300 mm substrate surface to a thickness of about 100 Å. Subsequently, a titanium nitride layer was deposited on the titanium layer by a CVD process using TDMAT precursor followed by $H_2/N_2$ plasma treatment. The titanium nitride layer was deposited to a thickness of about 50 Å. In most of the subsequent examples, the diborane gas usually contains hydrogen ($H_2$) as a carrier gas. However, the carrier gas could be nitrogen ($N_2$), or argon.

Examples

Example 1

The substrate was placed into a deposition chamber and exposed to a soak process under the following conditions:
Reagent: $B_2H_6$;
Pressure: about 15 Torr;
Temperature: about 375° C.;
Flow rates: about 200 sccm of 5% $B_2H_6$ in $N_2$ and about 8,000 sccm of $H_2$;
Hydrogen/hydride flow rate ratio: about 800:1; and
Duration: about 10 seconds.

Next, a tungsten nucleation layer was formed on the barrier layer in the deposition chamber from the previous soak process using a pulsed-CVD process under the following conditions:
Reagents: $WF_6$, $B_2H_6$, and $H_2$;
Pressure: about 5 Torr;
Temperature: about 375° C.;
Flow rates: about 60 sccm of $WF_6$, about 100 sccm of 5% $B_2H_6$ in $N_2$, and about 6,000 sccm $H_2$;
Hydrogen/hydride flow rate ratio: about 1,200:1; and
Pulse duration: about 1.5 seconds.

The pulsed-CVD process was continued until the nucleation layer had a thickness of about 25 Å. Thereafter, the substrate was kept in the deposition chamber and exposed to a second soak process under the following conditions:
Reagent: $B_2H_6$ and $H_2$;
Pressure: about 30 Torr;
Temperature: about 375° C.;
Flow rates: about 200 sccm of 5% $B_2H_6$ in $N_2$ and about 8,000 sccm of $H_2$;
Hydrogen/hydride flow rate ratio: about 800:1; and
Duration: about 30 seconds.

Subsequently, a bulk tungsten layer was deposited using $WF_6$—$H_2$ to a thickness of about 500 Å on the nucleation layer using a CVD process at about 375° C.

Example 2

The substrate was placed into a deposition chamber and exposed to a soak process under the following conditions:
Reagent: $SiH_4$;
Pressure: about 90 Torr;
Temperature: about 400° C.;
Flow rates: about 200 sccm of $SiH_4$; and
Duration: about 24 seconds.

Next, a tungsten nucleation layer was formed on the barrier layer in the deposition chamber from the previous soak process using a pulsed-CVD process under the following conditions:
Reagents: $WF_6$, $B_2H_6$, and $H_2$;
Pressure: about 5 Torr;
Temperature: about 400° C.;
Flow rates: about 60 sccm of $WF_6$, about 100 sccm of 5% $B_2H_6$ in $N_2$, and about 6,000 sccm of $H_2$;
Hydrogen/hydride flow rate ratio: about 1,200:1; and
Pulse duration: about 1.5 seconds.

The pulsed-CVD process was continued until the nucleation layer had a thickness of about 25 Å. Thereafter, the substrate was kept in the deposition chamber and exposed to a second soak process under the following conditions:
Reagent: $B_2H_6$ and $H_2$;
Pressure: about 30 Torr;
Temperature: about 400° C.;
Flow rates: about 200 sccm of 5% $B_2H_6$ in $N_2$ and about 8,000 sccm of $H_2$;
Hydrogen/hydride flow rate ratio: about 800:1; and
Duration: about 20 seconds.

Subsequently, a bulk tungsten layer was deposited $WF_6$—$H_2$ to a thickness of about 500 Å on the second nucleation layer using a CVD process at about 400° C.

Example 3

The substrate was placed into a deposition chamber and exposed to a soak process under the following conditions:
Reagent: $SiH_4$;
Pressure: about 90 Torr;
Temperature: about 400° C.;
Flow rates: about 200 sccm of $SiH_4$; and
Duration: about 24 seconds.

Next, a tungsten nucleation layer was formed on the barrier layer in the deposition chamber from the previous soak process using a pulsed-CVD process under the following conditions:
Reagents: $WF_6$ and $SiH_4$;
Pressure: about 5 Torr;
Temperature: about 400° C.;
Flow rates: about 60 sccm of $WF_6$ and about 30 sccm of $SiH_4$; and
Pulse duration: about 1.5 seconds.

The pulsed-CVD process was continued until the nucleation layer had a thickness of about 20 Å. Thereafter, the substrate was kept in the deposition chamber and exposed to a second soak process under the following conditions:
Reagent: $B_2H_6$ and $H_2$;
Pressure: about 90 Torr;
Temperature: about 400° C.;
Flow rates: about 200 sccm of 5% $B_2H_6$ in $N_2$, and about 8,000 sccm of $H_2$;
Hydrogen/hydride flow rate ratio: about 800:1; and
Duration: about 20 seconds.

Next, another tungsten nucleation was formed using the pulsed-CVD process, until the nucleation layer had total thickness of about 40 Å. Following conditions are used:
Reagents: $WF_6$ and $SiH_4$;
Pressure: about 5 Torr;
Temperature: about 400° C.;
Flow rates: about 60 sccm of $WF_6$ and about 30 sccm of $SiH_4$; and
Pulse duration: about 1.5 seconds.

Subsequently, a bulk tungsten layer was deposited $WF_6$—$H_2$ to a thickness of about 500 Å on the second nucleation layer using a CVD process at about 400° C.

Example 4

The substrate was placed into a deposition chamber and exposed to a soak process under the following conditions:
Reagent: $B_2H_6$ and $H_2$;
Pressure: about 90 Torr;
Temperature: about 400° C.;
Flow rates: about 200 sccm of 5% $B_2H_6$ in $N_2$ and about 8,000 sccm of $H_2$;
Hydrogen/hydride flow rate ratio: about 800:1; and
Duration: about 15 seconds.

Next, a tungsten nucleation layer was formed on the barrier layer in the deposition chamber from the previous soak process using a pulsed-CVD process under the following conditions:

Reagents: $WF_6$ and $SiH_4$;
Pressure: about 5 Torr;
Temperature: about 400° C.;
Flow rates: about 60 sccm of $WF_6$ and about 30 sccm of $SiH_4$; and
Pulse duration: about 1.5 seconds.

The pulsed-CVD process was continued until the nucleation layer had a thickness of about 50 Å.

Subsequently, a bulk tungsten layer was deposited to a thickness of about 1,000 Å on the second nucleation layer using a CVD process at about 400° C.

Example 5

The substrate was placed into a deposition chamber and exposed to a soak process under the following conditions:
Reagent: $SiH_4$ and $H_2$;
Pressure: about 90 Torr;
Temperature: about 400° C.;
Flow rates: about 200 sccm of $SiH_4$; and
Duration: about 24 seconds.

Next, a tungsten nucleation layer was formed on the barrier layer in the deposition chamber from the previous soak process using a pulsed-CVD process under the following conditions:
Reagents: $WF_6$, $B_2H_6$ and $H_2$;
Pressure: about 5 Torr;
Temperature: about 400° C.;
Flow rates: about 60 sccm of $WF_6$ and about 100 sccm of 5% $B_2H_6$ in $N_2$, and about 6,000 sccm of $H_2$;
Hydrogen/hydride flow rate ratio: about 1,200:1; and
Pulse duration: about 1.5 seconds.

The pulsed-CVD process was continued until the nucleation layer had a thickness of about 25 Å.

Subsequently, a bulk tungsten layer was deposited to a thickness of about 1,000 Å on the second nucleation layer using a CVD process at about 400° C.

Example 6

The substrate was placed into a deposition chamber and exposed to a soak process under the following conditions:
Reagent: $B_2H_6$ and $H_2$;
Pressure: about 90 Torr;
Temperature: about 400° C.;
Flow rates: about 200 sccm of 5% $B_2H_6$ in $N_2$ and about 8,000 sccm of $H_2$;
Hydrogen/hydride flow rate ratio: about 800:1; and
Duration: about 15 seconds.

Next, a tungsten nucleation layer was formed on the barrier layer in the deposition chamber from the previous soak process using a pulsed-CVD process under the following conditions:
Reagents: $WF_6$ and $SiH_4$;
Pressure: about 5 Torr;
Temperature: about 400° C.;
Flow rates: about 60 sccm of $WF_6$ and about 30 sccm of $SiH_4$; and
Pulse duration: about 1.5 seconds.

The pulsed-CVD process was continued until the nucleation layer had a thickness of about 50 Å. Thereafter, the substrate was kept in the deposition chamber and a second nucleation layer was deposited on the first nucleation layer. The second nucleation layer was deposited by a traditional CVD process to a thickness of about 200 Å under the following conditions:
Reagents: $WF_6$ and $SiH_4$;
Pressure: about 30 Torr;
Temperature: about 400° C.; and
Flow rates: about 60 sccm of $WF_6$ and about 30 sccm of $SiH_4$.

Subsequently, a bulk tungsten layer was deposited to a thickness of about 2,000 Å on the second nucleation layer using a CVD process at about 400° C.

Example 7

The substrate was placed into a deposition chamber and exposed to a soak process under the following conditions:
Reagent: $B_2H_6$ and $H_2$;
Pressure: about 90 Torr;
Temperature: about 400° C.;
Flow rates: about 200 sccm of 5% $B_2H_6$ in $N_2$ and about 8,000 sccm of $H_2$;
Hydrogen/hydride flow rate ratio: about 800:1; and
Duration: about 20 seconds.

Next, a tungsten nucleation layer was formed on the barrier layer in the previously used deposition chamber using a pulsed-CVD process under the following conditions:
Reagents: $WF_6$, $B_2H_6$, and $H_2$;
Pressure: about 5 Torr;
Temperature: about 400° C.;
Flow rates: about 60 sccm of $WF_6$, about 30 sccm of $B_2H_6$, and about 4,000 sccm of $H_2$;
Hydrogen/hydride flow rate ratio: about 133:1; and
Pulse duration: about 1.5 seconds.

The pulsed-CVD process was continued until the nucleation layer had a thickness of about 25 Å. Thereafter, the substrate was kept in the deposition chamber and a second nucleation layer was deposited on the first nucleation layer. The second nucleation layer was deposited by a traditional CVD process to a thickness of about 150 Å under the following conditions:
Reagents: $WF_6$, $B_2H_6$, and $H_2$;
Pressure: about 30 Torr;
Temperature: about 400° C.;
Flow rates: about 60 sccm of $WF_6$, about 30 sccm of $B_2H_6$, and about 4,000 sccm of $H_2$; and
Hydrogen/hydride flow rate ratio: about 133:1.

Example 8

The substrate was placed into a deposition chamber and exposed to a soak process under the following conditions:
Reagent: $B_2H_6$ and $H_2$;
Pressure: about 90 Torr;
Temperature: about 400° C.;
Flow rates: about 200 sccm of 5% $B_2H_6$ in $H_2$ and about 8,000 sccm of $H_2$;
Hydrogen/hydride flow rate ratio: about 820:1; and
Duration: about 15 seconds.

Next, a tungsten nucleation layer was formed on the barrier layer in the same deposition chamber used during the soak process using a pulsed-CVD process under the following conditions:
Reagents: $WF_6$ and $SiH_4$;
Pressure: about 30 Torr;
Temperature: about 400° C.;
Flow rates: about 60 sccm of $WF_6$ and about 30 sccm of $SiH_4$; and
Pulse duration: about 1.5 seconds.

The pulsed-CVD process was continued until the nucleation layer had a thickness of about 150 Å. Thereafter, the substrate was kept in the deposition chamber and exposed to a second soak process under the following conditions:
- Reagent: $B_2H_6$ and $H_2$;
- Pressure: about 90 Torr;
- Temperature: about 400° C.;
- Flow rates: about 200 sccm of 5% $B_2H_6$ in $N_2$ and about 8,000 sccm of $H_2$;
- Hydrogen/hydride flow rate ratio: about 800:1; and
- Duration: about 15 seconds.

Finally, the substrate was maintained in the deposition chamber and a bulk tungsten layer was deposited to a thickness of about 2,000 Å on the nucleation layer using a CVD process at about 400° C.

Example 9

The substrate was placed into a deposition chamber and exposed to a soak process under the following conditions:
- Reagent: $B_2H_6$ and $H_2$;
- Pressure: about 90 Torr;
- Temperature: about 400° C.;
- Flow rates: about 200 sccm of 5% $B_2H_6$ in $N_2$ and about 8,000 sccm of $H_2$;
- Hydrogen/hydride flow rate ratio: about 800:1; and
- Duration: about 10 seconds.

Next, a tungsten nucleation layer was formed on the barrier layer in the deposition chamber used during the prior soak process using a pulsed-CVD process under the following conditions:
- Reagents: $WF_6$, $B_2H_6$, and $H_2$;
- Pressure: about 30 Torr;
- Temperature: about 400° C.;
- Flow rates: about 60 sccm of $WF_6$, about 30 sccm of $B_2H_6$, and about 6,000 sccm of $H_2$;
- Hydrogen/hydride flow rate ratio: about 200:1; and
- Pulse duration: about 1.5 seconds.

The pulsed-CVD process was continued until the nucleation layer had a thickness of about 100 Å. Thereafter, the substrate was kept in the deposition chamber and exposed to a second soak process under the following conditions:
- Reagent: $B_2H_6$ and $H_2$;
- Pressure: about 15 Torr;
- Temperature: about 400° C.;
- Flow rates: about 200 sccm of 5% $B_2H_6$ in $N_2$ and about 6,000 sccm of $H_2$;
- Hydrogen/hydride flow rate ratio: about 600:1; and
- Duration: about 10 seconds.

Finally, the substrate was maintained in the deposition chamber and a bulk tungsten layer was deposited to a thickness of about 2,000 Å on the nucleation layer using a CVD process at about 400° C.

While the foregoing is directed to embodiments of the invention, other and further embodiments of the invention may be devised without departing from the basic scope thereof, and the scope thereof is determined by the claims that follow.

The invention claimed is:

1. A method for forming a tungsten-containing material on a substrate, comprising:
   forming a tungsten nucleation layer over an underlayer disposed on the substrate while sequentially providing a tungsten precursor and a reducing gas into a process chamber during an atomic layer deposition process, wherein the reducing gas comprises hydrogen gas and a hydride compound and has a hydrogen/hydride flow rate ratio of about 100:1 or greater; and
   depositing a tungsten bulk layer over the tungsten nucleation layer.

2. The method of claim 1, wherein the reducing gas further comprises a carrier gas, and forming the reducing gas comprises:
   flowing the hydrogen gas into the process chamber at a flow rate within a range from about 1 slm to about 20 slm; and
   flowing a mixture of the hydride compound and the carrier gas into the process chamber at a flow rate within a range from about 50 sccm to about 500 sccm.

3. The method of claim 2, wherein the flow rate of the hydrogen gas is within a range from about 3 slm to about 15 slm and the flow rate of the mixture of the hydride compound and the carrier gas is within a range from about 75 sccm to about 400 sccm.

4. The method of claim 3, wherein the flow rate of the hydrogen gas is within a range from about 5 slm to about 10 slm and the flow rate of the mixture of the hydride compound and the carrier gas is within a range from about 100 sccm to about 300 sccm.

5. The method of claim 3, wherein the flow rate of the mixture of the hydride compound and the carrier gas comprises flowing the hydride compound into the process chamber at a flow rate within a range from about 1 sccm to about 40 sccm.

6. The method of claim 5, wherein the flow rate of the hydride compound is within a range from about 3 sccm to about 30 sccm.

7. The method of claim 6, wherein the flow rate of the hydrogen gas is within a range from about 5 slm to about 10 slm and the flow rate of the hydride compound is within a range from about 5 sccm to about 15 sccm.

8. The method of claim 2, wherein the mixture of the hydride compound and the carrier gas comprises about 5% diborane in nitrogen and the hydrogen/hydride flow rate ratio of the reducing gas is within a range from about 100:1 to about 1,000:1.

9. The method of claim 1, further comprising:
   exposing the underlayer to a pre-soak gas comprising the reducing gas during a pre-soak process, wherein the underlayer is exposed to the reducing gas for a time period within a range from about 5 seconds to about 60 seconds; or
   exposing the tungsten nucleation layer to a post-soak gas comprising the reducing gas during a post-soak process, wherein the tungsten nucleation layer is exposed to the reducing gas for a time period within a range from about 5 seconds to about 60 seconds.

10. The method of claim 1, wherein the tungsten bulk layer is deposited by a chemical vapor deposition process and has a resistivity measured across the substrate of about 10 μΩ-cm or less.

11. The method of claim 1, wherein the underlayer is a barrier layer and comprises a material selected from the group consisting of metallic titanium, titanium nitride, metallic tantalum, tantalum nitride, ruthenium, nickel, cobalt, metallic tungsten, tungsten nitride, silicides thereof, derivatives thereof, alloys thereof, and combinations thereof.

12. The method of claim 11, wherein the barrier layer comprises metallic titanium, titanium nitride, or combinations thereof.

13. A method for forming a tungsten-containing material on a substrate, comprising:
   forming a tungsten nucleation layer over a barrier layer disposed on a substrate while exposing the substrate sequentially to a tungsten precursor and a reducing gas within a process chamber during an atomic layer deposition process, wherein the barrier layer comprises titanium and the reducing gas comprises hydrogen gas and diborane and has a hydrogen/diborane flow rate ratio within a range from about 100:1 to about 1,000:1; and depositing a tungsten bulk layer over the tungsten nucleation layer.

14. The method of claim 13, wherein the reducing gas further comprises a carrier gas, and forming the reducing gas comprises:

flowing the hydrogen gas into the process chamber at a flow rate within a range from about 1 slm to about 20 slm; and flowing a mixture of the diborane and the carrier gas into the process chamber at a flow rate within a range from about 50 sccm to about 500 sccm.

15. The method of claim 14, wherein the flow rate of the hydrogen gas is within a range from about 3 slm to about 15 slm and the flow rate of the mixture of the diborane and the carrier gas is within a range from about 75 sccm to about 400 sccm.

16. The method of claim 15, wherein the flow rate of the hydrogen gas is within a range from about 5 slm to about 10 slm and the flow rate of the mixture of the diborane and the carrier gas is within a range from about 100 sccm to about 300 sccm.

17. The method of claim 15, wherein the flow rate of the hydrogen gas is within a range from about 5 slm to about 10 slm and the flow rate of the mixture of the diborane and the carrier gas comprises flowing the diborane into the process chamber at a flow rate within a range from about 3 sccm to about 30 sccm.

18. The method of claim 15, wherein the mixture of the diborane and the carrier gas comprises about 5% diborane in nitrogen, and the barrier layer comprises metallic titanium, titanium nitride, or combinations thereof.

19. A method for forming a tungsten-containing material on a substrate, comprising:

exposing a barrier layer disposed on a substrate to a pre-soak gas comprising diborane within a process chamber during a pre-soak process, wherein the barrier layer comprises metallic titanium, titanium nitride, or combinations thereof;

forming a tungsten nucleation layer over the barrier layer by sequentially:

providing a pulse of a tungsten containing precursor into the process chamber;

providing a pulse of a purge gas into the process chamber;

providing a pulse of a reducing gas into the process chamber;

providing a pulse of a purge gas into the process chamber, wherein the reducing gas comprises hydrogen gas and the diborane and has a hydrogen/diborane flow rate ratio of about 100:1 or greater;

exposing the tungsten nucleation layer to a post-soak gas comprising the diborane during a post-soak process; and depositing a tungsten bulk layer over the tungsten nucleation layer.

20. The method of claim 19, wherein the hydrogen/diborane flow rate ratio of the reducing gas is within a range from about 500:1 to about 1,000:1.

\* \* \* \* \*